United States Patent [19]

Shibata et al.

[11] Patent Number: 5,008,567

[45] Date of Patent: Apr. 16, 1991

[54] SIGNAL GENERATING CIRCUIT FREE FROM MALFUNCTION BASED ON NOISE

[75] Inventors: Kazuo Shibata; Toshio Komuro, both of Tokyo, Japan

[73] Assignee: NEC Corporation, Tokyo, Japan

[21] Appl. No.: 342,066

[22] Filed: Apr. 24, 1989

[30] Foreign Application Priority Data

Apr. 25, 1988 [JP] Japan ................. 63-101809

[51] Int. Cl.⁵ ............... H03K 17/16; H03K 19/003; H03K 19/017
[52] U.S. Cl. .................. 307/443; 307/448; 307/481
[58] Field of Search ........... 307/443, 572, 451, 576, 307/585, 481, 594, 595, 453, 473

[56] References Cited

U.S. PATENT DOCUMENTS

| | | | |
|---|---|---|---|
| 4,565,934 | 1/1986 | Southerland, Jr. | 307/453 |
| 4,567,386 | 1/1986 | Benschop | 307/453 |
| 4,620,116 | 10/1986 | Ozawa | 307/453 |
| 4,704,547 | 11/1987 | Kirsch | 307/443 |

FOREIGN PATENT DOCUMENTS

| | | | |
|---|---|---|---|
| 0077569 | 6/1977 | Japan | 307/481 |
| 0079338 | 5/1983 | Japan | 307/481 |
| 0145921 | 6/1987 | Japan | 307/453 |

Primary Examiner—Stanley D. Miller
Assistant Examiner—Toan Tran
Attorney, Agent, or Firm—Sughrue, Mion, Zinn Macpeak & Seas

[57] ABSTRACT

A signal generating circuit which generates an output signal in a dynamic manner without being influenced by noise is disclosed. The signal generating circuit comprises a first transistor connected between a power voltage source and an output node, and second and third transistors connected in series between the output node and a ground voltage line. A first signal which assumes an active level in a first period and an inactive a second period subsequent to the first period, is applied to a gate of the second transistor, and a second signal which assumes an active level for a first time duration in the second period and an inactive level in a remaining second time duration in the second period and the first period, is applied to a gate of the first transistor. A third signal which assumes an active level in the first period and an inactive level in the second time duration, is applied to a gate of the second transistor.

4 Claims, 3 Drawing Sheets

SIGNAL GENERATING CIRCUIT FREE FROM MALFUNCTION BASED ON NOISE

BACKGROUND OF THE INVENTION

1. Field of the Invention:

The present invention relates to a signal generating circuit formed of field effect transistors and, more particularly to a dynamic type signal generating circuit formed in a semiconductor integrated circuit.

2. Description of the Related Art:

As signal generators employed in integrated circuits, a source-follower type dynamic signal generating circuit is widely utilized. This type of signal generator usually comprises a pull-up field effect transistor connected between a power voltage source (Vcc) and an output node and a pull-down field effect transistor connected between the output node and a ground voltage line. A first input signal such as a reset signal is applied to a gate of the pull-down transistor while a second input signal such as a drive signal is applied to a gate of the pull-up transistor. In a first period such as a reset period, the first input signal is made a high level to render the pull-down transistor conductive. As a result, the output node is set at a potential of the ground voltage line (ground voltage). Then, the first input signal is turned to a low level to make the pull-down transistor non-conductive and a second period is initiated. In the second period, the second input signal is made at a high level for a relatively short time so that the output node is charged approximately to the power voltage Vcc. After the pull-up transistor is turned non-conductive, the output node is maintained at the charged level near Vcc by stray capacitance of the output node in a dynamic manner in a third period after the second period.

However, in the third period, if noise is applied to the ground voltage line so that the potential at the ground voltage line is lowered below the ground voltage, the pull-down transistor is erroneously made conductive irrespective of the low level of the first signal because the pull-down transistor is forward-biased by the lowered voltage at its source electrode which is connected to the ground voltage line. Accordingly, the charge in the stray capacitance at the output node is erroneously discharged through the pull-down transistor to take a non-correct logic level. Thus, the operation of the conventional signal generating circuit is easily affected by noise and lacks reliability of logic operation.

SUMMARY OF THE INVENTION

It is an object of the present invention to provide a signal generating circuit which is hardly affected by noise or the like.

It is another object of the present invention to provide a dynamic type signal generating circuit which can operately stably.

The signal generating circuit according to the present invention features a first field effect transistor having a source-drain path connected between a first node and an output node, second and third field effect transistors having their source-drain paths connected in series between the output node and a second node, means for supplying the first node with a power voltage, means for supplying the second node with a ground voltage, means for supplying a gate of the third transistor with a first signal which assumes an active level in a first period and an inactive level in a second period following the first period, means for supplying a gate of the first transistor with a second signal which assumes an active level in a first time duration within the second period and an inactive level in a second time duration after the first time duration within the second period, and means for supplying a gate of the second transistor with a third signal which assumes an active level in the first period and an inactive level in the second time duration.

According to the present invention, the third transistor is inserted between the output node and the second transistor and the third transistor are rendered non-conductive in the above second duration when the output node is laid under the high impedance state. Therefore, even when the ground voltage line is fallen to a voltage lower than the ground voltage by the noise and the third transistor is erroneously rendered conductive, the second transistor keeps non-conductive in this instance to prevent the formation of a current path between the output node and the second node. Thus, the high level at the output node can be stably maintained irrespective of noise.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Prior Art

Figure 1:
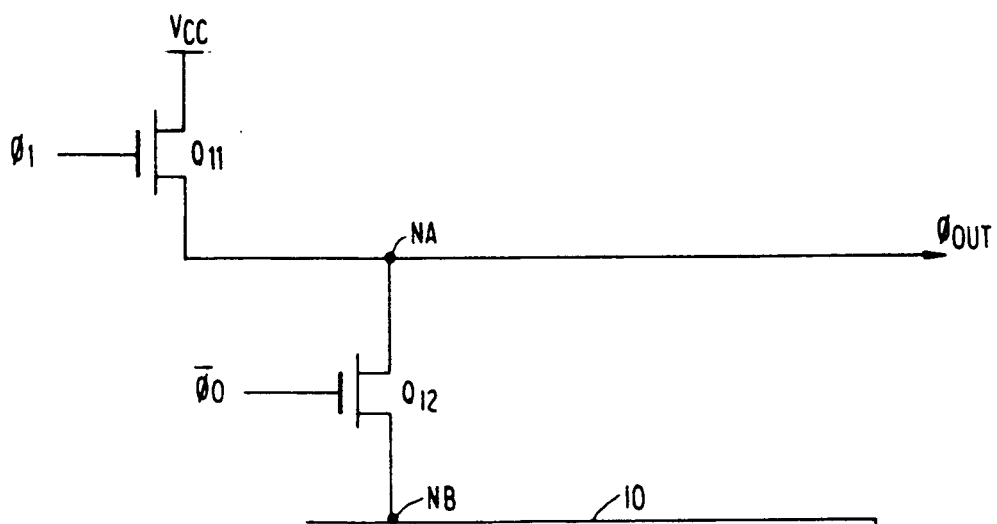
FIG. 1 is a schematic circuit diagram showing a signal generating circuit in the prior art.
Figure 2:
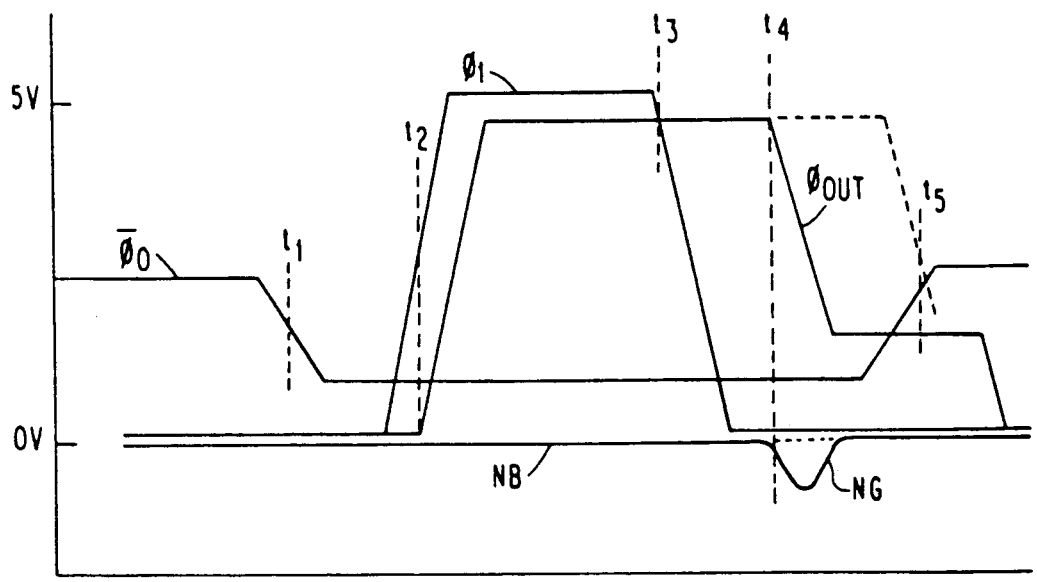
FIG. 2 is a timing diagram showing operation of the circuit of FIG. 1.

With reference to FIGS. 1 and 2, an example of a signal generating circuit in the prior art will be explained.

In the following explanation, N-channel MOS transistors are employed as field effect transistors and a high level near the power voltage Vcc and a low level (the ground voltage) correspond to logic "1" and "0" levels, respectively.

As shown in FIG. 1, the signal generating circuit comprises a pull-up transistor $Q_{11}$ having a drain connected to the power voltage Vcc, a source connected an output node NA and a gate supplied with a drive signal $\phi_1$, and a pull-down (reset) transistor having a drain connected to the output node NA, a source connected to a node NB of a ground voltage line 10 and a gate supplied with an input signal $\phi_0$. The input signal $\phi_0$ is an externally supplied signal from the outside an integrated circuit including the above signal generating circuit and has a TTL level, while the signal $\phi_1$ is an internally generated signal having MOS levels within the integrated circuit in accordance with the signal $\phi_0$. Namely, the signal $\phi_1$ is such a signal that rises to its high level in a one-shot manner in response to a fall of the external input signal $\phi_0$ to its low level.

Operations of the circuit of FIG. 1 will be explained with reference to FIG. 2.

Until a time point $t_1$, the signal $\phi_0$ is at the high level and the output signal $\phi_{OUT}$ at the output node NA is kept at the low level by the transistor $Q_{12}$. Then, at the time point $t_1$ the signal $\phi_0$ falls in level and thereafter at a time point $t_2$ the signal $\phi_1$ rises in levels so that the transistor $Q_{11}$ is rendered conductive to charge the output node to Vcc therethrough, and the output signal $\phi_{OUT}$ becomes the high level. In this instance the transistor $Q_{12}$ is kept non-conductive. At a time point $t_3$, the signal $\phi_1$ changes to the low level to make the transistor $Q_{11}$ non-conductive.

Therefore, the high level of the output signal $\phi_{OUT}$ is maintained by a stray capacitance of the output node NA under a high impedance state in a dynamic manner after $t_3$ and this state is expected to continue as indicate by a dotted line until a time point $t_5$ when the signal $\phi_0$ becomes the high level again. However, under the above high impedance state if a noise or the like NG is applied to the ground voltage line 10 to lower the potential at the node NB below the ground voltage (0 volt) by a threshold voltage $V_T$ of the transistor $Q_{12}$ or more at a time point $t_4$ when the external input signal $\phi_0$ is at the low (ground) level, the transistor $Q_{12}$ is erroneously rendered conductive. As a result, the output signal $\phi_{OUT}$ which should be at the high level until +5, becomes erroneously the low level, resulting in malfunction of the circuit.

Thus, in the above-described signal generating circuit, if the ground (GND) level is lowered in the minus direction due to noise or the like generated when the circuit is in an activated state (i.e., the external input signal $\phi_0$ is at its low level) and the one-shot signal $\phi_1$ is at its low level, that is, if the ground level falls below the threshold value $V_T$ of the transistor $Q_{12}$, the level of the output signal $\phi_{OUT}$ is undesirably lowered.

EMBODIMENT

Figure 3:
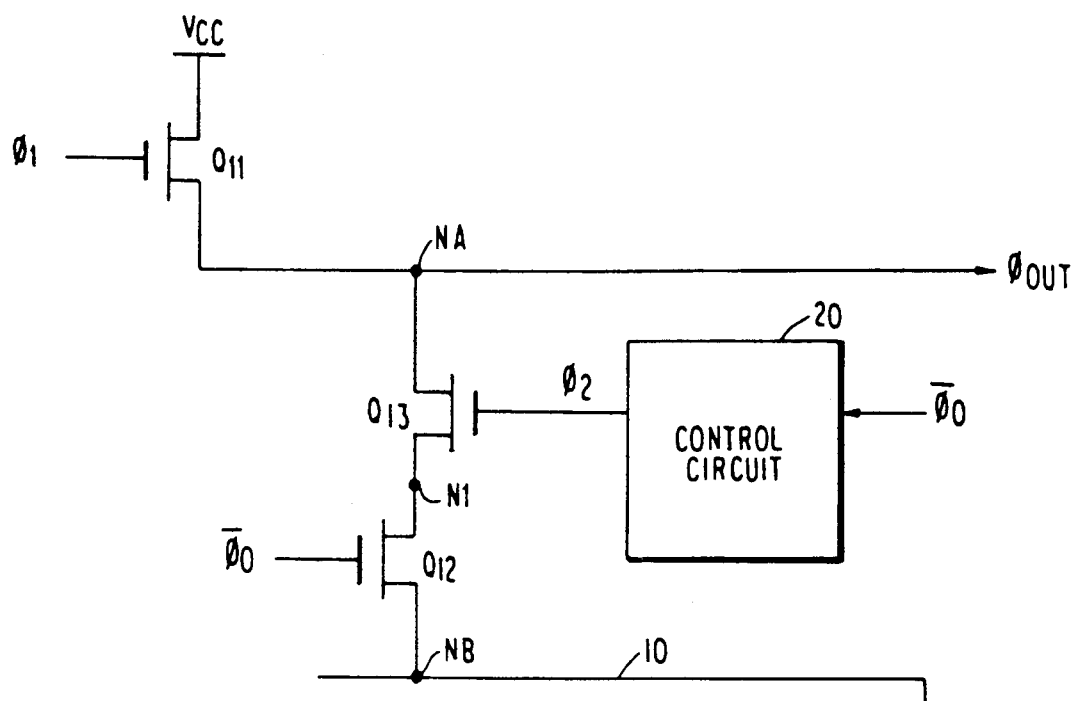
FIG. 3 is a schematic circuit diagram showing a signal generating circuit according to one preferred embodiment of the present invention.
Figure 4:
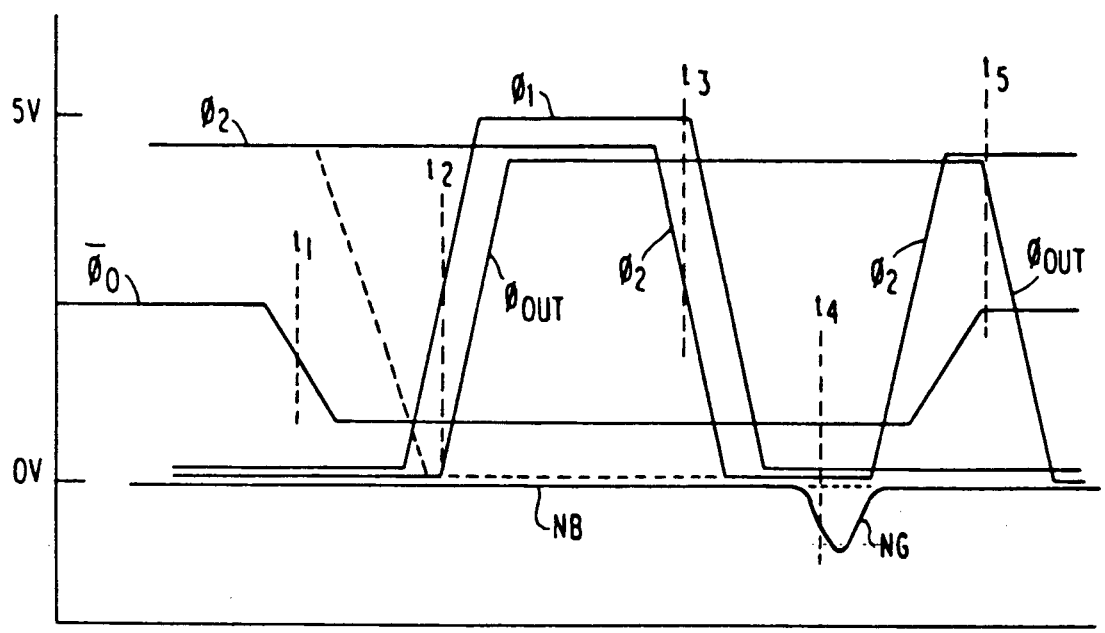
FIG. 4 is a timing diagram showing operation of the circuit of FIG. 3.

With reference to FIGS. 3 and 4, a signal generating circuit according to one preferred embodiment of the present invention will be explained.

In the following explanations, the elements or portions corresponding to those in the previous drawings are denoted by the same references and explanations therefor will be omitted.

As shown in FIG. 3, the signal generating circuit according to the present invention is obtained by adding control transistor $Q_{13}$ inserted between the output node NA and the drain of the transistor $Q_{12}$ and a control circuit 20 for generating a control signal $\phi_2$ applied to a gate of the transistor $Q_{13}$ in response to the input signal $\phi_0$, to the circuit of FIG. 1.

The control signal $\phi_2$ is such a signal that assumes a low level when the output node NA is laid under the high impedance state, that is during a period from the fall of the signal $\phi_2$ to the rise of the signal $\phi_0$. Therefore, the gate of the transistor $Q_{13}$ is kept at the low during the above period, and generation of the current path between the output node NA and the ground voltage node NB is prevented even when noise (NG) is applied to the ground voltage line 10 under the high impedance state of the output node NA.

With reference to FIG. 4, operations of the circuit of FIG. 3 will be explained.

In response to a fall of the signal $\phi_0$ to its low level at $t_1$, the signal $\phi_1$ rises to its high level in the one-short manner at $t_2$. When the external signal $\phi_0$ lowers to its low level and the signal $\phi_1$ rises to its high level in response to it, the transistor $Q_{11}$ turns on, so that the output signal $\phi_{OUT}$ rises to its high level. At this time, the transistor $Q_{13}$ is in a conductive (on) state since the signal $\phi_2$ from the control circuit 20 is at its high level, while the transistor $Q_{12}$ is in a non-conductive (off) state since the external input signal $\phi_0$ is at its low level. Accordingly, the output signal $\phi_{OUT}$ is in the high-level state. When the one-shot signal $\phi_1$ lowers to its low level at $t_3$ subsequently, the output signal $\phi_2$ from the control circuit 20 lowers to its low level and, since the external input signal $\phi_0$ is at its low level, both of the transistors $Q_{12}$ and $Q_{13}$ are off, so that the output signal $\phi_{OUT}$ remains at the high-level state even after $t_3$ under the high impedance state.

When the external input signal $\phi_0$ is reset to its to its high level at $t_5$, the control signal has already risen to its high level to turn on the transistors $Q_{13}$ and $Q_{12}$, so that the output signal $\phi_{OUT}$ is lowered to its low level. Since the output signal $\phi_2$ from the control circuit 20 is a signal delayed so that it remains in the low-level state only in a time zone during which the ground level may be lowered in the negative region due to internal noise or the like as shown by NG at $t_4$, even if the ground level is lowered in the negative region by the threshold value $V_T$ of the transistor $Q_{12}$ or more so as to cause the transistor $Q_{12}$ to turn on when the one-shot signal $\phi_1$ is at its low level, there is no risk of the level of the output signal $\phi_{OUT}$ being lowered since the transistor $Q_{13}$ is in the non-conductive state.

In the circuit of FIG. 3, it is also possible to lower the signal $\phi_2$ after $t_1$ as indicated by a dotted line for $\phi_2$ in FIG. 4.

Figure 5:
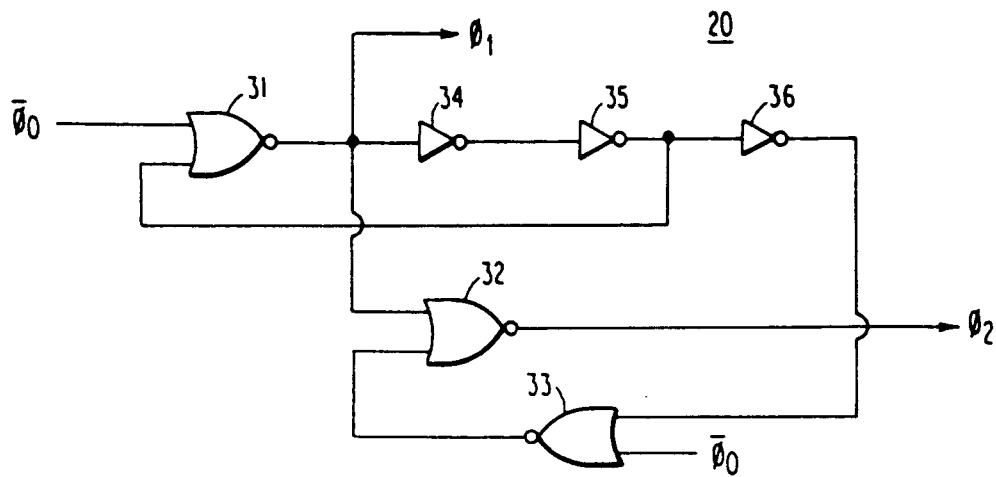
FIG. 5 is a schematic block diagram showing an example of a control circuit employed in the circuit of FIG. 3.

An example of the control circuit 20 is shown in FIG. 5.

As shown in FIG. 5, the control circuit 20 includes NOR gates 31, 32 and 33 and inverters 34, 35 and 36. The inverters 34 and 35 connected in cascade form a delay circuit, a delay time of which corresponds to the high level duration of the signal $\phi_1$. The NOR gate 32 receives the output of the NOR gate 31, i.e., the signal $\phi_1$ and an output signal of the NOR gate 33. The output of the NOR gate 33 is a delayed signal of the signal $\phi_1$ when the $\phi_0$ is at the low level.

Thus, the low level of the signal $\phi_2$ is generated from the NOR gate 32 when at least one of the signal $\phi_1$ and its delayed signal (output of the NOR gate 33) is at the high level during the period of the low level of $\phi_0$. In this case, the signal $\phi_2$ changes to the low level after $t_1$ as indicated by a dotted line in FIG. 4.

Figure 6:
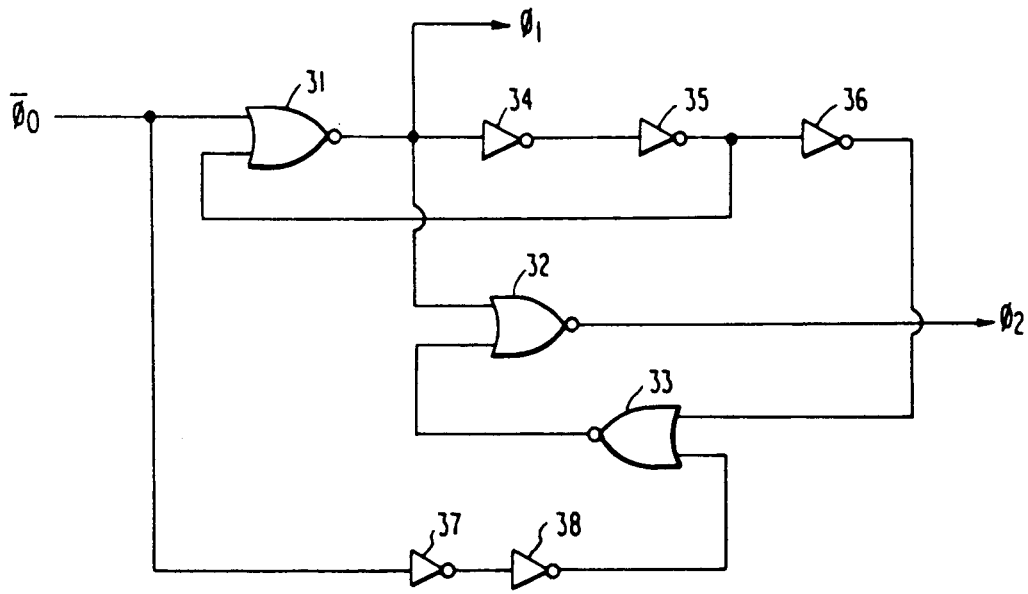
FIG. 6 is a schematic block diagram of another example of the control circuit.

FIG. 6 shows another example of the control circuit 20. This example is further provided inverters 37 and 38 connected between the NOR gate 33 and the signal $\phi_0$. The inverters 37 and 38 serve to delay the signal $\phi_0$. Therefore, the NOR gate 32 generates the low level of the signal $\phi_2$ when at least one of the signal $\phi_1$ and the output of the NOR gate 33 is at the high level.

As has been described above, in the present invention the transistor $Q_{13}$ is additionally provided between the output node and the transistor $Q_{12}$ which lowers the level of the output signal $\phi_{OUT}$, and the signal $\phi_2$ input to the transistor $Q_{13}$ is shifted to its low level only in a predetermined time zone during the activation period, thereby turning off the transistor $Q_{13}$ so as to cut off the transistor $Q_{12}$ from the output signal $\phi_{OUT}$, and thus making it possible to prevent the level of the output signal $\phi_{OUT}$ from being lowered by noise generated when the circuit is in an activated state.

We claim:

1. A signal generating circuit comprising a first field effect transistor having a source-drain path connected between a first node and an output node, second and third field effect transistors having their source-drain paths connected in series between said output node and a second node, means for supplying said first node with a power voltage, means for supplying said second node with a reference voltage, means for supplying a gate of said first transistor with a first signal which assumes an active level to render said first transistor conductive in a first period and an inactive level to render said first transistor non-conductive in subsequent second and third periods following said first period, means for supplying a gate of said third transistor with a second signal which assumes an active level to render said third transistor conductive in said third period and an inactive level in said first and second periods, and means for supplying a gate of said second transistor with a third signal, different from said second signal, which assumes an active level to render said second transistor conductive in said third period and an inactive level to render said second transistor non-conductive in said second period, wherein said output node is supplied with the power voltage through said first transistor in said first period and the power voltage at said output node is maintained in a dynamic manner throughout said second period and then discharged to the reference voltage through said second and third transistors in said third period.

2. The signal generating circuit according to claim 1, further comprising means for generating said first signal in response to said second signal.

3. The signal generating circuit according to claim 1, further comprising means for generating said third signal in response to said first signal.

4. The signal generating circuit according to claim 1, further comprising a control signal generator circuit for generating said first and third signals in response to said second signal, said control signal generator circuit including a first NOR gate having a first input end receiving said second signal, a second input end and an output end, a delay circuit having an input end coupled to the output end of said first NOR gate and an output end coupled to said second input end of said first NOR gate, a second NOR gate having a first input end coupled to the output end of said first NOR gate, a second input end and an output end, a third NOR gate having a first input end receiving said second signal, a second input end and an output end coupled to the second input end of said second NOR gate, an inverter having an input end coupled to the output end of said delay circuit and an output end coupled to the second input end of said third NOR gate, wherein said first signal is derived from the output end of said first NOR gate and said third signal is derived from the output end of said second NOR gate.

* * * * *

UNITED STATES PATENT AND TRADEMARK OFFICE
CERTIFICATE OF CORRECTION

PATENT NO. : 5,008,567

DATED : April 16, 1991

INVENTOR(S) : Kazuo Shibata and Toshio Komuro

It is certified that error appears in the above-identified patent and that said Letters Patent is hereby corrected as shown below:

On the title page:

Abstract, line 8, after, "inactive" insert -- level in --

Col. 2, line 62, delete $\phi_0$", insert -- $\overline{\phi}_0$ --

Col. 2, line 62, delete the second occurrence of "$\phi_0$", insert -- $\overline{\phi}_0$ --

Col. 2, line 67, delete "$\phi_0$", insert -- $\overline{\phi}_0$ --

Col. 3, line 2, delete "$\phi_0$", insert -- $\overline{\phi}_0$ --

Col. 3, line 5, delete "$\phi_0$", insert -- $\overline{\phi}_0$ --

Col. 3, line 8, delete "$\phi_0$", insert -- $\overline{\phi}_0$ --

Col. 3, line 20, delete "$\phi_0$", insert -- $\overline{\phi}_0$ --

Col. 3, line 26, delete "$\phi_0$", insert --$\overline{\phi}_0$ --

Col. 3, line 36, delete "$\phi_0$", insert --$\overline{\phi}_0$ --

Col. 3, line 55, delete "$\phi_0$", insert -- $\overline{\phi}_0$ --

Col. 3, line 60, delete "$\phi_2$", insert -- $\overline{\phi}_2$ --

Col. 3, line 60, delete "$\phi_0$, insert -- $\overline{\phi}$ --

Col. 4, line 1, delete "$\phi_0$", insert -- $\overline{\phi}_0$ --

Col. 4, line 3, delete "$\phi_0$", insert -- $\overline{\phi}_0$ --

UNITED STATES PATENT AND TRADEMARK OFFICE
CERTIFICATE OF CORRECTION

Page 2 of 2

PATENT NO. : 5,008,567
DATED : April 16, 1991
INVENTOR(S) : Kazuo Shibata and Toshio Komuro It is certified that error appears in the above-identified patent and that said Letters Patent is hereby corrected as shown below:

Col. 4, line 10, delete "$\phi_0$", insert -- $\overline{\phi}_0$ --

Col. 4, line 15, delete "$\phi_0$", insert -- $\overline{\phi}_0$ --

Col. 4, line 19, delete "$\phi_0$", insert -- $\overline{\phi}_0$ --

Col. 4, line 19, delete the second occurrence of "to its"

Col. 4, line 47, delete "$\phi_0$", insert -- $\overline{\phi}_0$ --

Col. 4, line 51, delete "$\phi_0$", insert -- $\overline{\phi}_0$ --

Col. 4, line 56, delete "$\phi_0$", insert -- $\overline{\phi}_0$ --

Col 4, line 57, delete "$\phi_0$", insert -- $\overline{\phi}_0$ --

Signed and Sealed this

Twenty-third Day of February, 1993

Attest:

STEPHEN G. KUNIN

*Attesting Officer*            *Acting Commissioner of Patents and Trademarks*